US 6,433,599 B2

(12) United States Patent
Friedrich et al.

(10) Patent No.: US 6,433,599 B2
(45) Date of Patent: Aug. 13, 2002

(54) CIRCUIT FOR DATA SIGNAL RECOVERY AND CLOCK SIGNAL REGENERATION

(75) Inventors: Dirk Friedrich, Munich; Michael Rozmann, Eichenau, both of (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 09/811,801

(22) Filed: Mar. 19, 2001

Related U.S. Application Data

(63) Continuation of application No. PCT/DE99/02742, filed on Sep. 1, 1999.

(30) Foreign Application Priority Data

Sep. 17, 1998 (DE) .......................................... 198 42 711

(51) Int. Cl.⁷ ................................................ H03L 7/06
(52) U.S. Cl. ...................................... 327/165; 327/156
(58) Field of Search ................................. 327/156–159, 327/165; 375/376; 331/1 A, DIG. 2

(56) References Cited

U.S. PATENT DOCUMENTS

| 4,234,852 A | * | 11/1980 | McCorkle ..................... 329/50 |
| 5,072,195 A | * | 12/1991 | Graham et al. ............. 327/156 |
| 5,194,828 A | * | 3/1993 | Kato et al. ................... 331/1 A |
| 5,363,419 A | | 11/1994 | Ho .............................. 331/1 A |
| 5,717,730 A | * | 2/1998 | Prakash et al. ............. 375/376 |
| 6,215,835 B1 | * | 4/2001 | Kyles .......................... 375/376 |
| 6,218,876 B1 | * | 4/2001 | Sung et al. .................. 327/156 |

FOREIGN PATENT DOCUMENTS

| EP | 0 299 724 A2 | 1/1989 |
| GB | 1 531 632 | 11/1978 |
| JP | 63 031 314 | 2/1988 |
| JP | 63 136 718 | 6/1988 |
| JP | 09 284 126 | 10/1997 |
| WO | WO 98/10519 | 3/1998 |

OTHER PUBLICATIONS

H.–J. Herog: "Auswahl von Bausteinen füdie Daten–und Takregenerierung in Telekom–und Datennetzen" U [selection of components for data and clock recovery in telecommunication and data nets], hf–praxis, No. 5, 1998, pp. 12–14.

* cited by examiner

Primary Examiner—Kenneth B. Wells
(74) Attorney, Agent, or Firm—Laurence A. Greenberg; Werner H. Stemer; Gregory L. Mayback

(57) ABSTRACT

The data and clock regeneration circuit can be completely integrated in a chip. The circuit has, in series, two independent PLL regulating stages which are optimally adjustable separately. The first PLL regulating stage has a large bandwidth and is optimized for maximum jitter tolerance and the second PLL regulating stage has a small bandwidth and is optimized for minimum jitter transfer. The circuit is suitable for use, for example, in transceivers for ATM, SONET, and SDH applications with signal transmission links in the Gbit range.

6 Claims, 1 Drawing Sheet

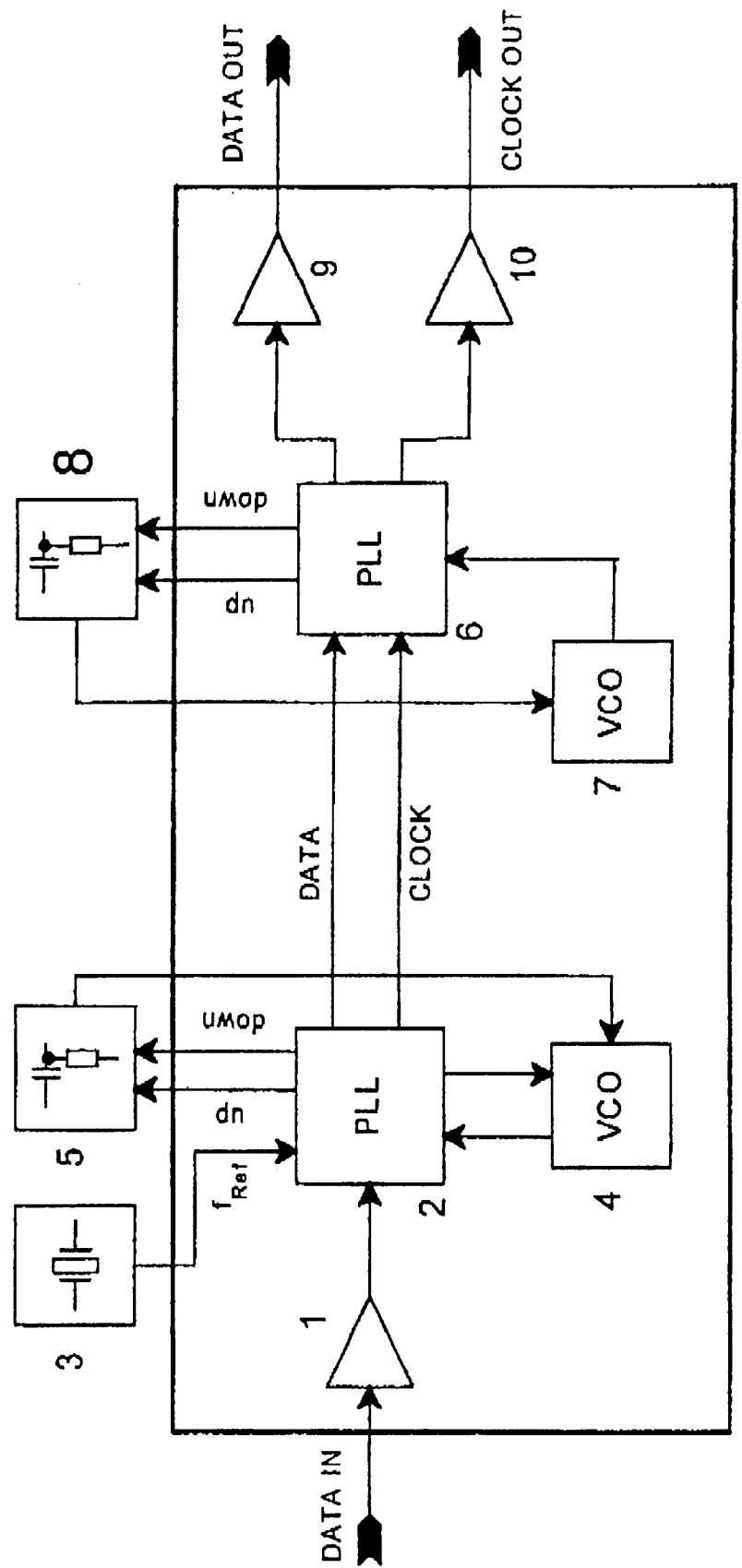

CIRCUIT FOR DATA SIGNAL RECOVERY AND CLOCK SIGNAL REGENERATION

CROSS-REFERENCE TO RELATED APPLICATION

This application is a continuation of copending International Application No. PCT/DE99/02742, filed Sep. 1, 1999, which designated the United States.

BACKGROUND OF THE INVENTION

Field of the Invention

The invention relates to a circuit, which can be completely integrated in an electronic module (chip), for data signal recovery and clock signal regeneration from an incoming serial data signal stream with a retiming circuit. The circuit uses a PLL (phase locked loop) regulating stage which is provided with a voltage-controlled oscillator (VCO) and to which the serial data signal stream is fed.

The invention is directed, in particular, at the recovery and the retiming of data signals and clock signals, respectively, from serial data streams, e.g. in transceiver circuits for ATM (asynchronous transfer mode), SONET (synchronous optical network) and SDH (synchronous digital hierarchy) applications.

It is known to realize the reconditioning of data signals and clock signals with the aid of a PLL regulating stage and retiming flip-flop. There are diverse types of phase and frequency detectors for this purpose. Reference is had, in this context, to a paper by Hans-Jürgen Herzog entitled "Auswahl von Bausteinen für die Daten- und Taktregenerierung in Telekom- und Datennetzen" ["Selection of modules for data and clock regeneration in telecommunications and data networks"], published in the journal "HF-Praxis", issue 5, 1998, volume 4, pp. 12–14.

The incoming data signal is generally a serial bit sequence encumbered with noise and jitter. Various requirements are imposed on a transceiver which receives and evaluates this data signal stream, in order that a signal of required quality is produced again on the output side. Two important requirements, which, however, are partly at odds with one another, are the values for the jitter tolerance and for the jitter transfer. The jitter tolerance defines the maximum permissible input jitter which the circuit can still process in a manner free from errors. This value should be as large as possible. The jitter transfer defines the maximum permissible jitter which is allowed to be transferred from the input to the output. It should be as small as possible.

In order to fulfill these jitter requirements, the bandwidth of the PLL regulating loop used in the reconditioning of data signals and clock signals must be adapted to the requirements. A large PLL regulating loop bandwidth is necessary for a large jitter tolerance.

A large bandwidth enables the PLL regulating loop to effect rapid following in terms of the frequency and phase of the incoming signal and thus reliable sampling in the temporal center of a data bit. This fact then also results in the circuit having high input sensitivity.

A small PLL regulating loop bandwidth is necessary for a low jitter transfer. This ensures that the PLL regulating stage does not follow the high-frequency jitter, noise and other interference and thus impair the quality of the recovered data signal.

In order to simultaneously meet both conditions to some extent, one is thus forced to adopt a compromise. In this case, the bandwidth of such a PLL regulating loop is in a very narrow range. Since a PLL regulating stage can in part comprise highly nonlinear components, particularly in the case of completely integrated PLL regulating loops, it is difficult to calculate or realize the bandwidth.

SUMMARY OF THE INVENTION

The object of the invention is to provided a circuit, which can be completely integrated on an electronic chip and thus implemented without external circuitry, for the recovery and for the retiming of data signals and clock signals, respectively, from serial data streams, in particular for a simpler construction of ATM, SONET and SDH-conforming transceiver circuits for possible use in signal transmission links in the gigabit range, the jitter requirements being complied with and, consequently, a data signal of required quality, that is to say having a prescribed low bit error rate, being produced again on the output side.

With this and other objects in view there is provided, in accordance with the invention, a circuit for data signal recovery and clock signal regeneration from an incoming serial data signal stream comprising data bits. The circuit, which is completely integrateable into an electronic component, comprises:

a first PLL regulating stage having a voltage-controlled oscillator, an input receiving a serial data signal stream, and an output outputting a clock signal;

a second PLL regulating stage connected to the output of the first PLL regulating stage and in series therewith, the second PLL regulating stage having an input receiving the clock signal and an output outputting an output clock signal;

the first and second PLL regulating stages being independent of one another and each being optimally adjustable separately, whereby the first PLL regulating stage is set at a first bandwidth, and the second PLL regulating stage is set at a second bandwidth smaller than the first bandwidth.

In other words, the objects of the invention are achieved, according to the invention, which relates to a circuit of the type mentioned in the introduction, by virtue of the fact that there is connected downstream of the PLL regulating stage in series a second PLL regulating stage, that the two PLL regulating stages are independent and are each optimally adjustable separately, that the first PLL regulating stage is set in such a way that it has a large bandwidth and is optimized for maximum jitter tolerance, and that the second PLL regulating stage is set in such a way that it has a small bandwidth and is optimized for minimum jitter transfer.

The invention thus solves the problem by connecting two independent PLL regulating stages in series, for each of which the optimum setting is performed separately. The first PLL regulating stage has a large bandwidth and regenerates the level of the incoming signal.

As a result, the signal/noise ratio becomes less critical and the second PLL regulating stage can guarantee error-free data regeneration, even without sampling in the absolute center of a data bit. The second PLL regulating stage has a small bandwidth and can thus be optimized for low jitter transfer.

Complete integration on a single chip is possible since the circuit according to the invention can tolerate relatively large parameter fluctuations of the circuit.

In accordance with an added feature of the invention, the second PLL regulating stage is configured to synchronize the clock signal and the output clock signal and wherein a transition from the first PLL regulating stage to the second PLL regulating stage is performed via a synchronization of the clock signal and the output clock signal realized in the second PLL regulating stage. That is, the transition from the first PLL regulating stage to the second PLL regulating stage is performed by means of synchronization of the two clock signals which is carried out in the second PLL regulating stage. The second PLL regulating stage can be realized in a simple manner and without a high technical outlay on circuitry.

In accordance with an additional feature of the invention, a constant frequency crystal oscillator is provided to stabilize a reference frequency of the first PLL regulating stage.

In accordance with another feature of the invention, the circuit is particularly suitable in a transceiver circuit at an end of a transmission link of a telecommunications and data transmission network.

In the preferred embodiment of the invention, the signal transmission link operates in a gigabit range.

Other features which are considered as characteristic for the invention are set forth in the appended claims.

Although the invention is illustrated and described herein as embodied in a circuit for data signal recovery and clock signal regeneration, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawing.

BRIEF DESCRIPTION OF THE DRAWING

The sole FIGURE of the drawing is a schematic block circuit diagram of a circuit according to the invention.

DESCRIPTION OF THE PREFERRED EMBODIMENTS

Referring now to the FIGURE of the drawing in detail, an incoming digital data stream DATA IN is fed to a first PLL regulating stage 2 via an isolation amplifier 1. The reference frequency $f_{Ref}$ of the PLL regulating stage 2 is formed by a crystal oscillator 3, is therefore stable in frequency and holds a voltage-controlled oscillator in a valid operating range.

The first PLL regulating stage 2 is provided with a voltage-controlled oscillator (VCO) 4, which may be realized by a ring oscillator, for example, and an integrator 5, with which the bandwidth of the PLL regulating stage 2 is determined. There is connected downstream of the first PLL regulating stage 2 a second PLL regulating stage 6, which is likewise provided with a voltage-controlled oscillator 7 and an integrator 8 which critically determines the bandwidth of the second PLL regulating stage 6.

The finally recovered data signals and clock signals DATA OUT and CLOCK OUT respectively, are passed out from the second PLL regulating stage 6 via a respective isolation amplifier 9 and 10. The optimum setting for the two independent PLL regulating stages 2 and 6 is performed separately in each case. The first PLL regulating stage 2 has a large bandwidth and regenerates the level of the incoming signal DATA IN.

The signal/noise ratio thus becomes less critical, and the second PLL regulating stage 6 ensures error-free data recovery, and it does not necessarily have to effect sampling in the absolute center of the data bits of the data signals DATA fed from the first PLL regulating stage 2.

In contrast to the first PLL regulating stage 2, the second PLL regulating stage 6 has a small bandwidth and can be optimized for minimum jitter transfer. The transition from the first PLL regulating stage 2, in which the data signals DATA and clock signals CLOCK are recovered, is effected by means of synchronization of the two clock signals CLOCK and CLOCK OUT in the PLL regulating stage 6, which can be realized in a relatively simple manner.

We claim:

1. A circuit for data signal recovery and clock signal regeneration from an incoming serial data signal stream comprising data bits, comprising:

a first PLL regulating stage having a voltage-controlled oscillator, an input receiving a serial data signal stream, and an output outputting a clock signal;

a second PLL regulating stage connected to said output of said first PLL regulating stage and in series therewith, said second PLL regulating stage having an input receiving the clock signal and an output outputting an output clock signal;

said first and second PLL regulating stages adjusted separately, said first PLL regulating stage being set at a first bandwidth, and said second PLL regulating stage being fixed at a second bandwidth smaller than the first bandwidth.

2. The circuit according to claim 1, wherein said second PLL regulating stage is configured to synchronize the clock signal and the output clock signal and wherein a transition from said first PLL regulating stage to said second PLL regulating stage is performed via a synchronization of the clock signal and the output clock signal realized in said second PLL regulating stage.

3. The circuit according to claim 1, which comprises a constant frequency crystal oscillator connected to stabilize a reference frequency of said first PLL regulating stage.

4. A circuit assembly for data signal recovery and clock signal regeneration, comprising:

a transceiver circuit at an end of a transmission link of a telecommunications and data transmission network emitting a serial data signal stream having data bits; and a circuit receiving the serial data signal from the transceiver circuit and including a first PLL regulating stage having a voltage-controlled oscillator, an input receiving a serial data signal stream, and an output outputting a clock signal; a second PLL regulating stage connected to said output of said first PLL regulating stage and in series therewith, said second PLL regulating stage having an input receiving the clock signal and an output outputting an output clock signal; said first and second PLL regulating stages each being adjusted separately, said first PLL regulating stage being set at a first bandwidth, and said second PLL regulating stage being fixed a t a second bandwidth smaller than the first bandwidth.

5. A circuit assembly for data signal recovery and clock signal regeneration, comprising:

a signal transmission link operating in a gigabit range; and a circuit being connected to said signal transmission link and including a first PLL regulating stage having a voltage-controlled oscillator, an input receiving a serial data signal stream, and an output outputting a clock signal; a second PLL regulating stage connected to said output of said first PLL regulating stage and in series therewith, said second PLL regulating stage having an input receiving the clock signal and an output outputting an output clock signal; said first and second PLL regulating stages each being adjusted separately, said first PLL regulating stage being set at a first bandwidth, and said second PLL regulating stage being fixed at a second bandwidth smaller than the first bandwidth.

6. An electronic module assembly, comprising an electronic module containing a completely integrated circuit including a first PLL regulating stage having a voltage-controlled oscillator, an input receiving a serial data signal stream, and an output outputting a clock signal; a second PLL regulating stage connected to said output of said first PLL regulating stage and in series therewith, said second PLL regulating stage having an input receiving the clock signal and an output outputting an output clock signal; said first and second PLL regulating stages each being adjusted separately, said first PLL regulating stage being set at a first bandwidth, and said second PLL regulating stage being fixed at a second bandwidth smaller than the first bandwidth.

* * * * *